United States Patent
Huott et al.

(10) Patent No.: US 6,314,540 B1
(45) Date of Patent: Nov. 6, 2001

(54) PARTITIONED PSEUDO-RANDOM LOGIC TEST FOR IMPROVED MANUFACTURABILITY OF SEMICONDUCTOR CHIPS

(75) Inventors: William V. Huott, Holmes; Mary P. Kusko, Hopewell Junction, both of NY (US); Gregory O'Malley, Essex Junction, VT (US); Bryan J. Robbins, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/290,516

(22) Filed: Apr. 12, 1999

(51) Int. Cl.[7] .............................. G01R 31/28; G06F 11/00
(52) U.S. Cl. ................................................. 714/738
(58) Field of Search ................................ 714/32, 33, 35, 714/724, 728, 735, 736, 738, 739

(56) References Cited

U.S. PATENT DOCUMENTS

| | | | |
|---|---|---|---|
| 3,715,573 | * | 2/1973 | Vogelsberg .............................. 714/33 |
| 3,787,669 | * | 1/1974 | Muehldorf ............................ 714/738 |
| 4,688,222 | | 8/1987 | Blum . |
| 4,841,485 | | 6/1989 | Prilik et al. . |
| 4,991,176 | * | 2/1991 | Dahbura et al. ...................... 714/738 |
| 5,150,366 | | 9/1992 | Bardell, Jr. et al. . |
| 5,239,262 | | 8/1993 | Grutzner et al. . |
| 5,278,842 | | 1/1994 | Berry, Jr. et al. . |
| 5,297,151 | | 3/1994 | Gruetzner et al. . |
| 5,313,424 | | 5/1994 | Adams et al. . |
| 5,341,315 | * | 8/1994 | Niwa et al. ........................... 714/738 |
| 5,377,197 | * | 12/1994 | Patel et al. ............................ 714/724 |
| 5,444,717 | * | 8/1995 | Rotker et al. ......................... 714/744 |
| 5,485,471 | * | 1/1996 | Bershteyn ............................. 714/739 |
| 5,488,612 | | 1/1996 | Heybruck . |
| 5,535,164 | | 7/1996 | Adams et al. . |
| 5,553,082 | | 9/1996 | Connor et al. . |
| 5,557,619 | | 9/1996 | Rapoport . |
| 5,596,587 | * | 1/1997 | Douglas et al. ...................... 714/739 |
| 5,633,877 | | 5/1997 | Shephard, III et al. . |
| 5,659,551 | | 8/1997 | Huott et al. . |
| 5,661,732 | | 8/1997 | Lo et al. . |
| 5,684,946 | * | 11/1997 | Ellis et al. ............................. 714/33 |
| 5,740,412 | | 4/1998 | Chan et al. . |
| 5,790,564 | | 8/1998 | Adams et al. . |
| 5,796,752 | * | 8/1998 | Sun et al. ............................. 714/738 |
| 5,983,381 | * | 11/1999 | Chakradhar et al. ................ 714/738 |
| 5,987,636 | * | 11/1999 | Bommu et al. ...................... 714/738 |
| 6,067,651 | * | 5/2000 | Rohrbaugh et al. ................. 714/738 |
| 6,145,106 | * | 11/2000 | Chakradhar et al. ................ 714/742 |

OTHER PUBLICATIONS

Bardell et al. "Self–Testing of Multichip Logic Modules" 1982 IEEE Test Conference, pp. 200–204.

(List continued on next page.)

*Primary Examiner*—Albert Decady
*Assistant Examiner*—Joseph Torres
(74) *Attorney, Agent, or Firm*—Lynn Augspurger Cantor Colburn LLP

(57) ABSTRACT

A partitioned pseudo-random logic test (PRLT) for integrated circuit chips for improving manufacturability is disclosed. The technique makes available previously difficult-to-collect empirical data to accurately improve test effectiveness while significantly lowering test time and test cost. An embodiment includes a method for testing IC chips, including generating values for latches for a complete test pattern set, partitioning the test pattern set into a plurality of partitioned test pattern subsets, and running the subsets against a chip.

Another embodiment is directed to a system that tests IC chips, having a latch value generator that generates values for latches for a complete test pattern set, a test pattern divider that partitions the complete test pattern set into a plurality of partitioned test pattern subsets, and a tester that runs the partitioned test pattern subsets against the chip.

18 Claims, 3 Drawing Sheets

OTHER PUBLICATIONS

Keller et al "Built–in self–test support in the IBM Engineering Design System" IBM J.Res.Develop., vol. 34, No. 2/3, Mar./May 1990, pp. 406–415.

Starke "Design for testability and diagnosis in a VLSI CMOS System/370 processor" IBM J.Res.Develop., vol. 34, No. 2/3 Mar./May 1990, pp. 355–362.

Foote et al. Testing the 400 MHz IBM Generation–4 CMOS Chip 1997 IEEE International Test Conference, pp. 106–114.

Kusko Microprocessor Test and Test Tool Meethodology for the 500 MHz IBM S/390 G5 Chip, 1998 IEEE International Test Conference, pp. 717–726.

* cited by examiner

PARTITIONED PSEUDO-RANDOM LOGIC TEST FOR IMPROVED MANUFACTURABILITY OF SEMICONDUCTOR CHIPS

FIELD OF THE INVENTION

The present invention relates to testing of integrated circuit chips, and more particularly to testing for improved manufacturability. Even more particularly, this invention relates to an improved testing technique for IC chips.

TRADEMARKS

S/390 and IBM are registered trademarks of International Business Machines Corporation, Armonk, N.Y., U.S.A. and Lotus is a registered trademark of its subsidiary Lotus Development Corporation, an independent subsidiary of International Business Machines Corporation, Armonk, N.Y. Other names may be registered trademarks or product names of International Business Machines Corporation or other companies.

BACKGROUND

Very large scale integration (VLSI) logic integrated circuit (IC) chips, also known as microprocessors, contain very large numbers of logic circuits. Testing the many logic circuits in a chip is an important part of the manufacturing process of the chip.

Logic circuits typically include many interconnected logic gates. The various logic gates include, e.g., "AND" gates, "OR" gates, "NAND" gates, "NOR" gates, "NOT" gates, "XOR" gates and so on. A logic circuit has a number of inputs for receiving data, and a number of outputs for outputting data. The logic circuit is designed such that for each input pattern, of a set of one or more input patterns, provided at the inputs of the logic circuit, a corresponding predetermined output pattern is produced at the outputs of the circuit.

If there is a fault or defect in the logic circuit, then for one or more input patterns provided at the inputs of the circuit, the observed output patterns produced at the outputs of the circuit will differ from the expected predetermined output patterns.

One way to test for faults in a logic circuit is to apply each possible input pattern at the inputs of the logic circuit, and to compare the actual output pattern with the expected output pattern. For small numbers of possible input patterns, the cost of storing the expected output patterns and performing this deterministic testing is reasonable. However, for large numbers of possible input patterns, the cost of such deterministic testing is too high.

An alternative method of testing for faults in a logic circuit applies random input test patterns at the inputs of the logic circuit, and compares the actual output patterns with the expected output patterns. The number of random test patterns needed to achieve a selected level of confidence that a logic circuit contains no faults depends on the circuit design.

Another alternative method of testing for faults in a logic circuit applies one or more weighted random input test patterns at the inputs of a logic circuit, and compares the actual output patterns with the expected output patterns. The weights may be uniform across all digits in the test pattern, or the weights may be nonuniform. The weighted random test patterns are selected to achieve, efficiently and at a low cost, a desired level of confidence that the logic circuit contains no faults.

As integrated circuit chip devices have become more densely packed with electronic components and more complex, the need for effectively testing such circuits has become more complex and important. This is especially true of digital logic circuits. In order to provide a mechanism for testing complex circuitry of this type, a number of built-in self test (BIST) methodologies have been employed including level sensitive scan design (LSSD) techniques. LSSD design can be performed in accordance with the teachings of "Level Sensitive Logic System," U.S. Pat. No. 3,783,254, and "Method of Level Sensitive Testing A Functional Logic System," U.S. Pat. No. 3,761,695, both to Edward B. Eichelberger and of common assignee to this invention, the contents of which are incorporated herein by reference in their entireties. In the LSSD methodology, a long string of shift register latches (SRLs)is employed in a dual function role which does not detract from normal circuit operation. In particular, a shift register (SR) string provides both normal input during circuit operation and also provides a mechanism for providing test input signals to the circuit for testing purposes. These tests may be employed, for example, immediately subsequent to chip manufacture, and in the field to diagnose error conditions. Depending on the source of input signals to the SRL scan string, either normal operations or test operations can be carried out.

An example testing technique includes initializing a set of latches and generating a set of pseudo-random latch value patterns for all latches in a chip. A clock pulse scans the test pattern and the output is then compared to an expected result. Thereafter, a new set of latch values can be loaded into the latches.

In the testing of VLSI logic chips,i.e. microprocessors, tester time directly affects customer cost. Using pseudo-random pattern generation techniques, such as, e.g., logic built-in self test (LBIST), there is a trade-off between tester time (cost to a customer) and test coverage (quality shipped to the customer). Using more patterns increases test coverage, but the increased number of patterns require longer tester time. The reader is referred to "Built-In Self-Test Support in the IBM Engineering Design system," by B. L. Keller and T. J. Snethen, in the IBM Journal of Research and Development 34, No 2/3, pages 406–415, March/May 1990, describing the development of software to support the LBIST test technique, the contents of which are incorporated by reference in their entirety.

Software models can predict pattern effectiveness, but they are only an approximation of effectiveness. While test coverage asymptotically increases with a greater number of patterns, it becomes difficult to predict when the limit of pseudo-random logic test (PRLT) effectiveness is reached. An inaccurate prediction can have a large effect on product cost and quality. Conventional testing methods do not provide for reducing tester time and cost while accurately monitoring test pattern effectiveness.

Thus, conventional test pattern selection decisions were based on a software approximation of test effectiveness. Test time was reduced by applying different types of patterns, i.e. deterministic patterns with the added cost of increased tester buffer memory requirements as well as effectiveness uncertainty.

Another conventional solution was to remove patterns assumed to be "not effective enough," without any empirical backing.

Conventionally, high test coverage with an assumed high effectiveness was achieved only through using large numbers of patterns resulting in long test times.

It is desirable to reduce long test times while maintaining test effectiveness.

SUMMARY OF THE INVENTION

The present invention comprises a method for testing integrated circuit chips, including the steps of generating values for latches for a complete test pattern set, partitioning the complete test pattern set into a plurality of partitioned test pattern subsets, and running the partitioned test pattern subsets against a chip.

A feature of the invention includes a method that simulates a complete pattern set and determines a starting value for each of the plurality of partitioned test pattern subsets. One embodiment includes a feature that uses the starting value for each of the plurality of partitioned test pattern subsets. Another embodiment includes a feature that simulates the entire chip. Another embodiment includes a feature that simulates only the starting values and determines the values of the latches.

In an embodiment of the invention, the plurality of partitioned test pattern subsets are divided in equal sized partitions. In another, the plurality of partitioned test pattern subsets are divided in unequal sized partitions. In another embodiment, unequal sized partitions are ordered in a sequence of patterns based on a determination of effectiveness of the tests. In yet another embodiment, the unequal sized partitions can be reordered with shorter test patterns ordered first in a sequence of patterns.

In one embodiment of the invention applies the plurality of partitioned test pattern subsets on the chip in the order in which the subsets were partitioned.

Other features of the invention include analyzing the effectiveness of the plurality of partitioned test pattern subsets. An embodiment determines empirically whether excessive testing was performed and if so then eliminates the tests.

Another determines the most effective patterns and can reorder the sequence of partitions to perform the most effective tests first. Another determines the least effective patterns and reorders partitions to perform the least effective tests last. Yet another determines empirically whether insufficient testing was performed and if so then adds tests.

Another embodiment features determining a granularity of the plurality of test pattern subsets. The invention can determine a granularity for a testing environment. The testing environment can include manufacturing and engineering environments.

Another embodiment of the invention is directed to a system including an integrated circuit chip, that tests integrated circuit chips, including a latch value generator that generates values for latches for a complete test pattern set, a test pattern divider that partitions the complete test pattern set into a plurality of partitioned test pattern subsets, and a tester that runs the partitioned test pattern subsets against the chip.

Yet another embodiment includes a system having an integrated circuit chip including means for testing integrated circuit chips including means for generating values for latches for a complete test pattern set, means for partitioning the complete test pattern set into a plurality of partitioned test pattern subsets, and means for running the partitioned test pattern subsets against the chip.

Features of the invention provide for partitioned pseudo-random logic testing (PRLT). Partitioned PRLT provides for reduced tester time and costs while accurately monitoring pattern effectiveness. Partitioned pseudo-random test provides for tuning of the test pattern set for maximum efficiency using highly reliable empirical data using the lowest tester time and test cost, while ensuring optimal quality.

Further features and advantages of the invention, as well as the structure and operation of various embodiments of the invention, are described in detail below with reference to the accompanying drawings.

DESCRIPTION OF THE DRAWINGS

The foregoing and other features and advantages of the invention will be described with reference to the accompanying drawings. In the drawings, like reference numbers generally indicate identical, functionally similar, and/or structurally similar elements. Also in the figures, the left most digit of each reference number corresponds to the figure in which the reference number is first used.

DETAILED DESCRIPTION OF THE INVENTION

The preferred embodiment of the invention is discussed in detail below. While specific implementations are discussed, it should be understood that this is done for illustration purposes only. A person skilled in the relevant art will recognize that other components and configurations may be used without departing from the spirit and scope of the claimed invention.

Logic Built-In Self-Test (LBIST) is a pseudo-random pattern generation technique. Three random pattern testing techniques well known in the art are discussed in P. H. Bardell and W. H. McAnney, "Self-Testing of Multichip Modules," Proceedings of the IEEE International Test Conference, 1982, pp. 200–204, the contents of which are incorporated herein by reference in their entirety.

The reader is also referred to the following documents in which the use and evolution of LBIST in various IBM products is reviewed. The documents include Cordt W. Starke, "Design for Testability and Diagnosis in a VLSI CMOS S/370 Processor," IBM Journal of Research and Development 34, No. 2/3, pages 355–362, March/May 1990; T. Foote, D. Hoffman, W. Huott, T. Koprowski, M. Kusko, B. Robbins, "Testing the 400 MHz IBM Generation-4 CMOS Chip," Proceedings of the IEEE International Test Conference, 1997, pages 106–114; and M. Kusko, B. Robbins, T. Snethen, P. song, T. Foote, W. Huott, "Microprocessor Test and Test Tool Methodology for the 500 MHz IBM S/390 G5 Chip, " Proceedings of the International Test Conference, 1998, pages 717–726, the contents of which are incorporated herein by reference in their entireties.

An Example Embodiment of an Implementation of the Invention

Figure 1:
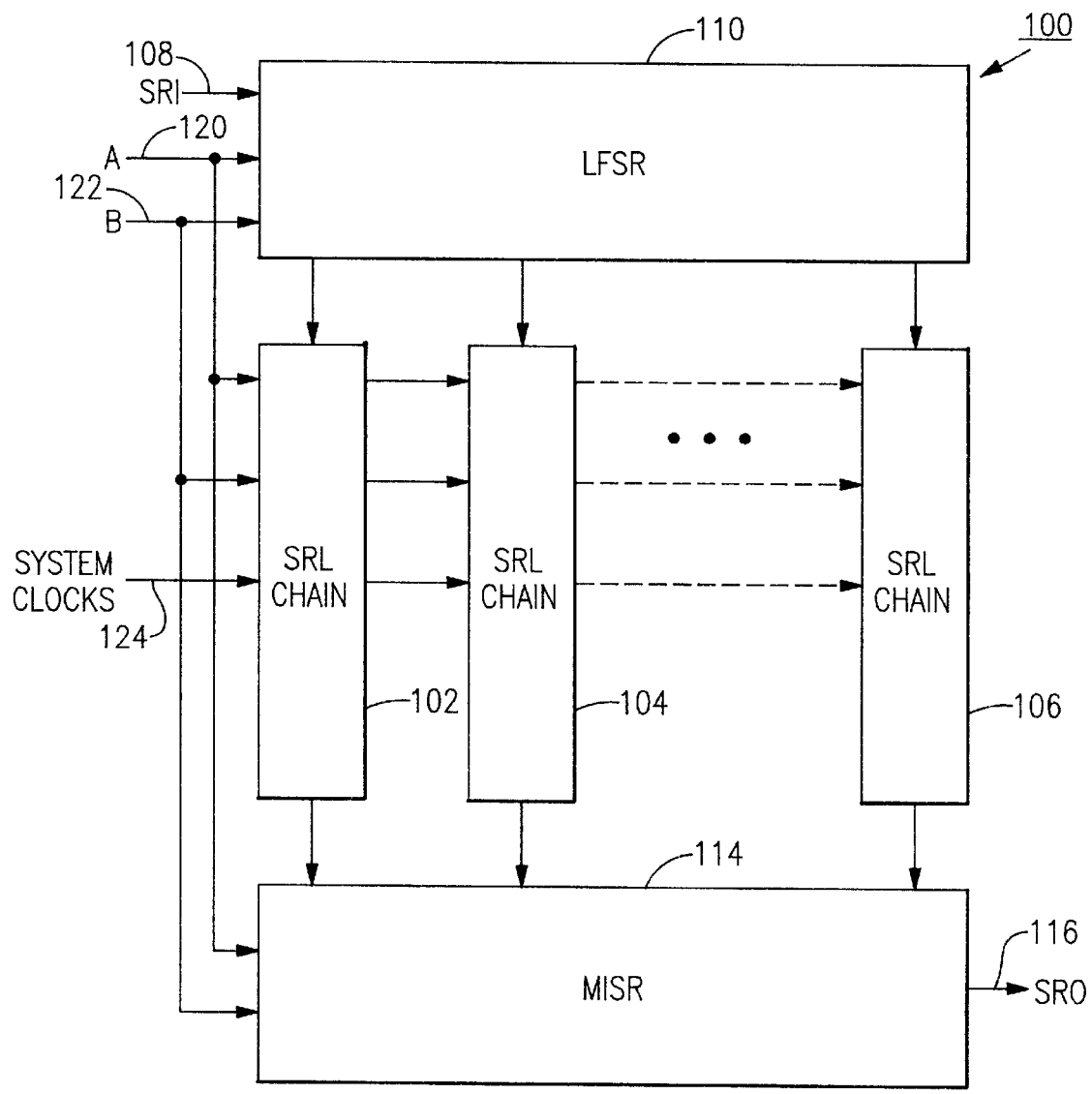
FIG. 1 is a block diagram of an exemplary LBIST random test socket as could be employed in practicing the present invention.

One pattern testing technique illustrating a random test diagram 100 is depicted in FIG. 1. Diagram 100 includes an A clock 120, a B clock 122 and system clocks 124 coupled to parallel shift register latch (SRL) chains 102, 104 and 106. It would be apparent to those skilled in the art that additional SRL chains (not shown) can also be included in diagram 100. A pseudo-random binary number generator called a linear feedback shift register 110, coupled to the SRL chains, is also coupled to a level sensitive scan design (LSSD) shift register string scan input (SRI) 108, the A clock 120 and the B clock 122. A multiple input signature register (MISR) 114, coupled SRL chains 102, 104 and 106, and to A clock 120 and B clock 122 includes and output at a shift register string scan-out port (SRO) 116. The output 116 can be further analyzed by, e.g., a signature analyzer (SA).

Each test loads a random test vector into the shift register latches (SRLs) and cycles through each of the machine clocks, using A and B clocks 120 and 122, to capture the test responses in the internal shift register latches, and finally unloads the device to MISR 114 and the SR string through SRO 116.

A pseudo-random logic pattern generator (PRLP) such as, e.g., LFSR 110, conventionally requires thousands, if not millions of patterns in order to completely and effectively test a complex VLSI logic chip. Test times increase linearly with pattern counts but test coverage only increases asymptotically to 100% of coverage.

When near the asymptote of the test coverage curve, an increase in test coverage by 0.1% may require a 10 times increase in the number of pseudo-random patterns. Ensuring a complete and thorough pattern set is crucial to product quality but may have an adverse effect on test and production cost.

Figure 2:
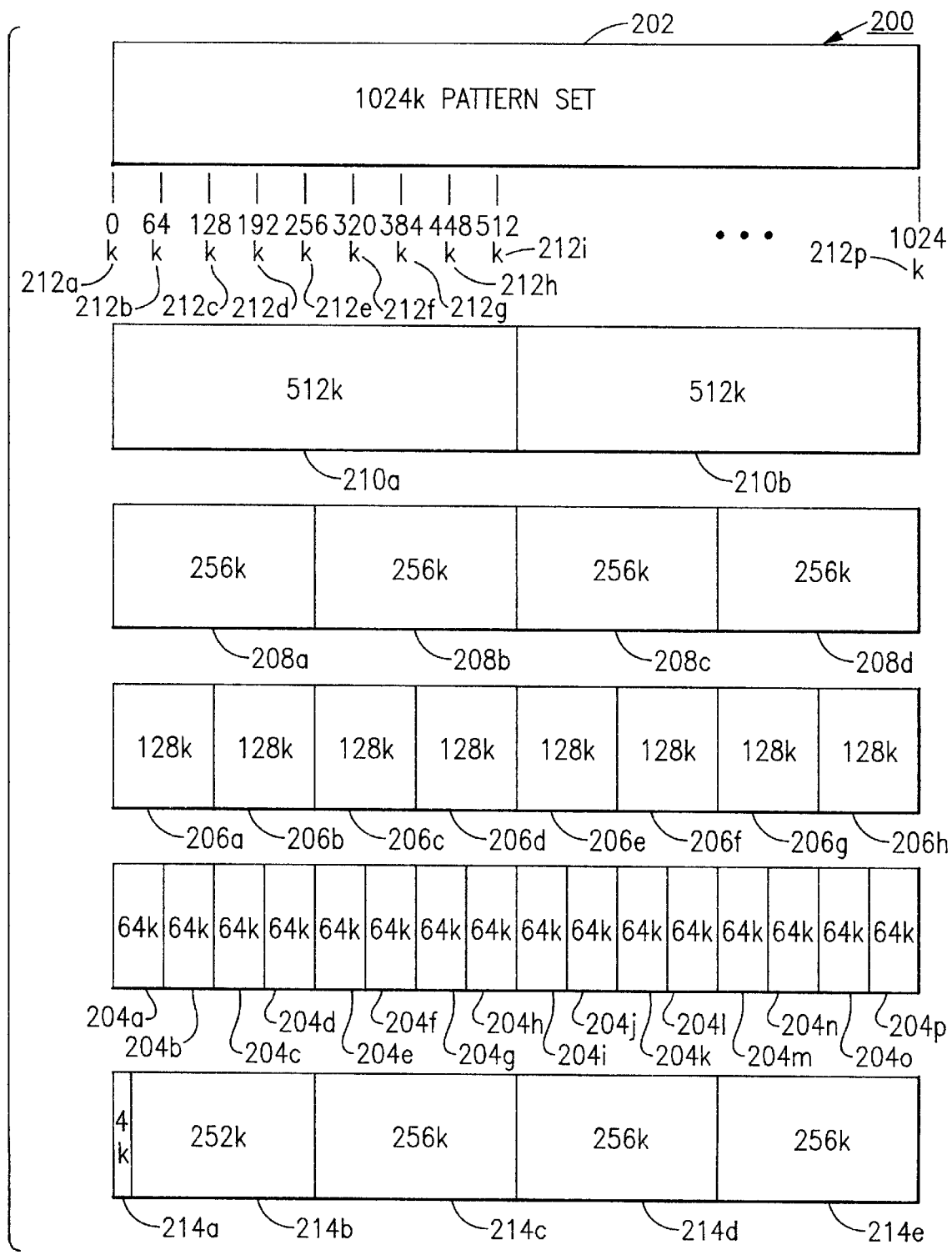
FIG. 2 is a block diagram depicting an exemplary test pattern set and several exemplary partitioned test pattern subsets implementing an embodiment of the present invention.

Partitioned pseudo-random test according to the present invention includes breaking up of a full pseudo-random pattern set into smaller sequential pattern sets, or subsets. FIG. 2 depicts an exemplary partitioned pattern set 200. For example, a 1024 k pattern set 202 can be broken into 16 sequential 64 k pattern subsets 204a, 204b, 204c, 204d, 204e, 204f, 204g, 204h, 204i, 204j, 204k, 204l, 204m, 204n, 204o and 204p. Each of the 64 k pattern subsets 204a–204p would be a pass/fail test as was the 1024 k pattern set 202 test. The sum of these 64 k pattern subsets 204a–204p can equal the original 1024 k pattern set 202, both in effectiveness and in the actual logic values applied to the VLSI chip. Another exemplary partition depicted in FIG. 2, is 128 k pattern subsets 206a, 206b, 206c, 206d, 206e, 206f, 206g and 206h. FIG. 2 also includes 256 k pattern subsets 208a, 208b, 208c and 208d, and 512 k pattern subsets 210a and 210b. It should be apparent to a person having skill in the art, that the subset partitions 204–210 are provided as examples and are not intended as an exhaustive list. FIG. 2 also includes exemplary unbalanced pattern subsets 214a, 214b, 214c, 214d and 214e, described further below. Using other partitions according to the present invention would be apparent to a person skilled in the art.

Using stop-on-first-fail testing, test time for defective chips using partitioned subsets 204–210, and 214 is dramatically reduced as compared to applying the full 1024 k pattern set 202.

In a specific example, assume that test application time is 1 minute per 64 k subset 204, or 16 minutes for 1024 k pattern set 202. In this example, assume that the majority of defective chips fail the first 64 k subset 204a test. In this example then, the majority of failing chips require only 1 minute of test time. Using 64 k partitions saves 15 minutes of test time rather than performing a test for a full 1024 k pattern set 202. The time spent testing defective chips adds significantly to test cost, especially when chip yields are low.

An example testing technique can include initializing a set of latches and generating a set of pseudo-random latch value patterns for all latches in a chip. A clock pulse can scan the test pattern into the source registers of the chip and the output can then be compared to an expected result. When the output does not match the expected result, the chip is identified as defective. If a test pattern results in a match with the expected result, a new set of latch values can be loaded into the latch to test other circuits of the chip.

A pattern set can be very long, such as, e.g., a million testing patterns. According to the present invention, this pattern set can be partitioned into smaller subsets. Partitioning can be performed in different granularities as illustrated in FIG. 2 above.

It should be noted that example partitions 204–210 of FIG. 2 are all of equal size. The partitions are so-called "even-partitions." In an alternative embodiment of the invention, uneven partitioning is used to create partitions of varying sizes. For example as illustrated with partitions 214a–214e, in one embodiment, smaller sized partitions can be used up front, to save manufacturing test time. Then if the chip passes the smaller sized partitioned tests, such as, e.g., partition 214a, then subsequent partitions can be performed which can be of larger size such as, e.g., 214b–214e. Tester time is saved for those chips that will fail in the shorter partitioned sets. Thus, uneven partitions, unbalanced partitions and skewed partitions could be used rather than partitions of even size.

In another embodiment of the present invention, partitions of different granularity can be used depending on the testing environment. FIG. 2 depicts several different granularities of even sized partitions. Depending on the testing environment, a different granularity of tests could be selected. For example, in a manufacturing environment, 4 sequential 256 k 208a–208d partition tests might be optimal or more manageable, whereas in an engineering test lab environment with greater flexibility for testing, 16 sequential 64 k 204a–204p partition tests might be possible. A person skilled in the art will appreciate that the present invention can also use a combination of differing granularities and uneven partitioning to improve the effectiveness of testing.

Beyond helping decrease test time and associated costs, pseudo-random logic testing can also accurately quantify test effectiveness. Test effectiveness analysis is introduced with reference to FIG. 2. Using a conventional testing technique, while a full pattern set 202 either passes or fails, it is not known whether the pattern set was excessive in test pattern application, or if it was properly sized. Partitioned pseudo-random tests, such as, e.g., subsets 204–210, provide testing granularity needed to empirically quantify test effectiveness.

If test effectiveness is insufficient, large numbers of chips continue to fail the latter test subset patterns, such as, e.g., 204i–204p, while passing the earlier ones, such as, e.g., 204a–204d.

If the test set is excessive, then no chips will fail the latter subsets, e.g., 204m–204p, without previously failing the earlier ones, e.g., 204a–204h. For this case, the latter subsets 204m–204p never uniquely catch defective chips and with this approach these subsets are never even applied to defective chips. If the pattern set proves excessive, test time for passing chips can further be reduced by eliminating ineffective pattern subsets.

For insufficient pattern sets, additional tests can always be added to the test suite.

Partitioned pseudo-random testing allows tuning of a test pattern set for maximum efficiency using highly reliable empirical data, i.e., using the lowest test time and cost but ensuring optimal quality.

Figure 3:
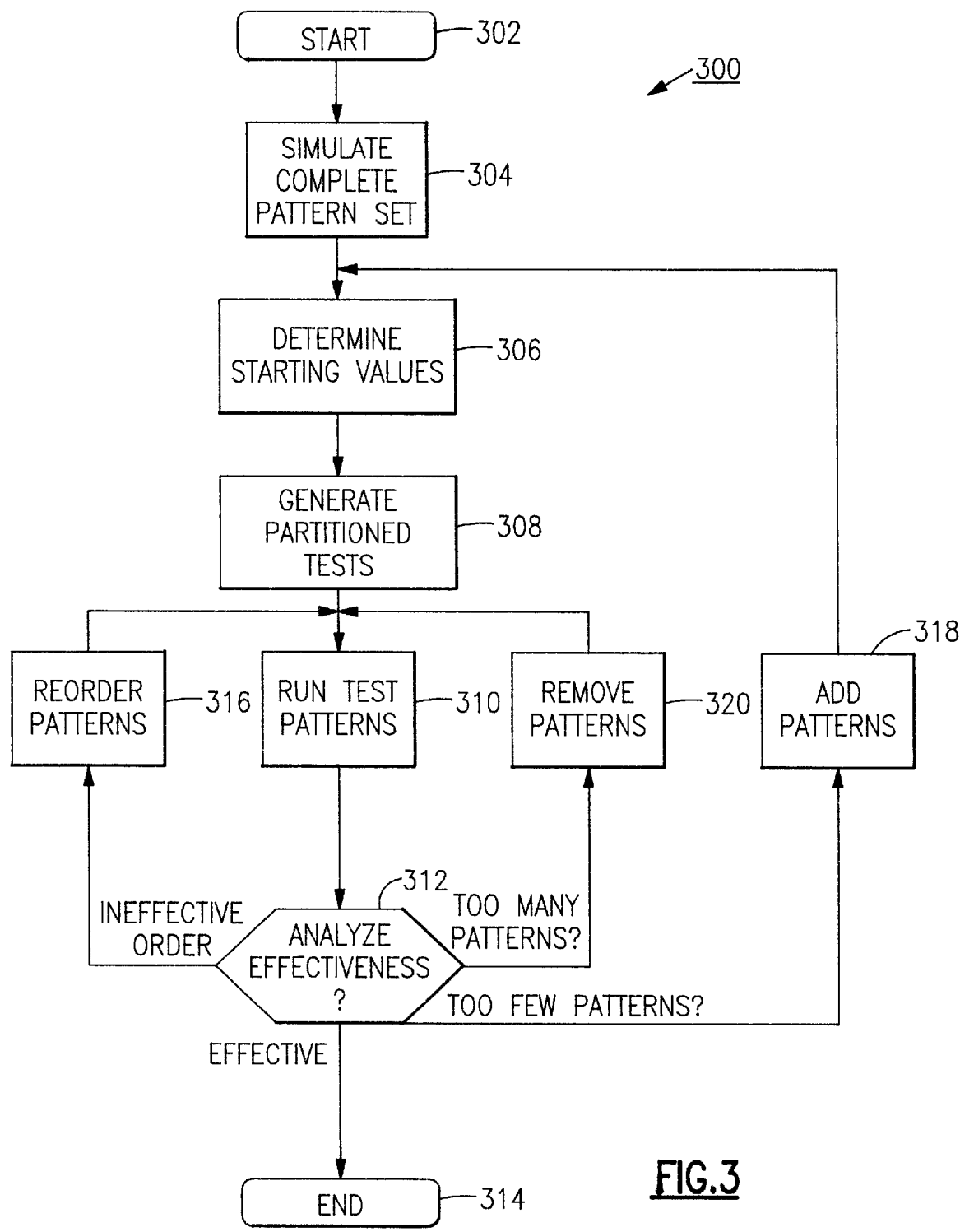
FIG. 3 is a flow diagram depicting an exemplary process flowchart of an exemplary operational technique according to the present invention.

The invention is now described in greater detail with reference to a process flowchart 300 depicted in FIG. 3, illustrating an example technique of the present invention. Flowchart 300 begins with step 302 and continues immediately with step 304.

In step 304, a complete pattern set is simulated. Simulating a complete pattern set is part of generating a full set of values for the complete pattern set. An example of a complete pattern set is 1024 k pattern set 202 of FIG. 2. A complete pattern set can be determined by using standard test pattern generation and simulation techniques. From step 304, flowchart 300 continues with step 306.

In step 306, all starting values are determined. Starting values, also known as "seeds," are the values of the latches at a starting point of any partitioned subset. Seeds are the base controls for a pseudo-random test. Specifically, for the example of 16 sequential 64 k subsets 204a–204p, starting points 212a–212p, respectively, are illustrated in FIG. 2. This step is necessary when a partitioned pattern set is used rather than a complete pattern set, because the same values must still go through each of the latches as would have gone through using the complete pattern set. In one embodiment, ending values can be determined at the completion of each partition, to permit non-consecutive partition testing by loading starting values and comparing ending values to expected values. In another embodiment, ending values can be equivalent to the next sequential partition's starting values. The combination of steps 304 and 306 generate values for a complete test pattern set. The complete simulation simulates the entire chip. In an alternative embodiment of the invention, only the seed values or starting values need be simulated, and the values of the latches are determined. In this embodiment, a person skilled in the art will appreciate, that only the pseudo-random logic test values for the latches need to be simulated rather than the values of the entire chip. From step 306, flowchart 300 continues with step 308.

In step 308, partitioned tests are generated. The complete pattern set of values generated in steps 304 and 306 can be divided up to generate partitioned tests, using the starting values determined in step 306. By divying up the complete pattern set into partitions, the tests can identify defective chips at an earlier time, i.e., at the failure of a partition test rather than at the completion of the complete test. As discussed above, partitions can be, e.g., of even, uneven, unbalanced and skewed sizes. From step 308, flowchart 300 continues with step 310.

In step 310, the partitioned tests are run. In one embodiment, the sequential partitioned test patterns are run consecutively. The partitions are run using the calculated starting values. For example, the tests can be run in a manufacturing environment by applying the test patterns on the chip hardware in the order in which the tests were partitioned. By performing the tests in consecutive order, the combination of all the test pattern partitions yields results equivalent to the complete test pattern. From step 310, flowchart 300 continues with step 312.

In step 312, data is analyzed for testing effectiveness. In one embodiment, data can be analyzed to determine the effectiveness of the tests, as previously introduced with reference to FIG. 2 above. For example, analysis can determine whether excessive testing is being conducted, i.e., whether too many patterns are being tested, and if so then as depicted in step 320, patterns can be removed and flowchart 300 can continue with step 310. If instead, effectiveness is analyzed and insufficient testing is being performed, i.e., too few patterns are being tested, then patterns can be added as shown in step 318, and flowchart 300 can continue with step 306. If test pattern effectiveness is analyzed and it is found that pattern order is ineffective, then patterns can be reordered as shown in FIG. 316, and flowchart 300 can continue with step 310. Finally, if in step 312 testing is found effective, then flowchart 300 can end with step 314.

In one embodiment, the determination of effectiveness or ineffectiveness can be used by designers and manufacturers to improve testing, to identify and troubleshoot problems, and to suggest improvements to testing methodology.

In one embodiment, tests can be reordered based on the determined effectiveness. Cumulative effectiveness or lack thereof can be used to identify possible changes to testing such as, for example, eliminating, reordering or adding patterns to testing. For example, a more effective test can be reordered to be performed first to identify defective chips sooner. In another embodiment of the invention, less effective tests can be identified and, e.g., can be eliminated or moved to a later order to be performed after more effective tests. Also, new patterns can be added to supplement tests which are found to be ineffective.

In another embodiment, suppose that analysis determines that in one of the partitions, all chips appear to be failing. For example, when certain areas of the chips are exercised with certain logic values going through the latches, unexpected outputs result indicating defective chips. If this is not a random defect, then a design or process problem that needs to be fixed can be identified and overcome.

In another embodiment, test effectiveness may suggest that a different partition granularity should be used. For example, if very few defects are found in several partitions, then, those partitions could be combined into one larger, unbalanced or skewed partition, and could be reordered to be performed at the end. In another example, if the majority of defective chips are found in a 4 k partition, partition 214a, then that 4 k partition could be reordered to be performed first as shown in FIG. 2, yielding tester time savings.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A method for testing integrated circuit chips, comprising the steps of:
   (a) generating values for latches for a complete test pattern set;
   (b) partitioning said complete test pattern set into a plurality of partitioned test pattern subsets; and
   (c) running said partitioned test pattern subsets against a chip, said running comprising:
   executing one of said partitioned test pattern subsets against said chip to generate output;
   comparing said output to an expected result; and
   exiting said running of said partitioned test pattern subsets if said output does not match said expected result.

2. The method according to claim 1, wherein said step (a) comprises the steps of:
   (1) simulating a complete pattern set; and
   (2) determining a starting value for each of said plurality of partitioned test pattern subsets.

3. The method according to claim 2, wherein said step (b) comprises:
    (3) using said starting value for each of said plurality of partitioned test pattern subsets.

4. The method according to claim 2, wherein said step (1) comprises simulating the entire chip.

5. The method according to claim 2, wherein said step (1) comprises simulating only said starting values and determining the values of said latches.

6. The method according to claim 1, wherein said plurality of partitioned test pattern subsets are divided in equal sized partitions.

7. The method according to claim 1, wherein said plurality of partitioned test pattern subsets are divided in unequal sized partitions.

8. The method according to claim 7, wherein said unequal sized partitions are ordered in a sequence of patterns based on a determination of effectiveness.

9. The method according to claim 7, wherein said unequal sized partitions are reordered with shorter test patterns ordered first in a sequence of patterns.

10. The method according to claim 1, wherein said step (c) further comprises the steps of:
    (4) applying said plurality of partitioned test pattern subsets on the chip in sequenced order in which said subsets were partitioned.

11. The method according to claim 1, further comprising the step of:
    (e) analyzing effectiveness of said plurality of partitioned test pattern subsets.

12. The method according to claim 11, wherein said step (e) comprises at least one step of the following set of steps:
    (5) determining empirically whether excessive testing was performed and if so then eliminating tests;
    (6) determining the most effective patterns and reordering partitions to perform the most effective tests first;
    (7) determining the least effective patterns and reordering partitions to perform the least effective tests last; and
    (8) determining empirically whether insufficient testing was performed and if so then adding tests.

13. The method according to claim 1, wherein said step (b) comprises the step of:
    (9) determining a granularity of said plurality of test pattern subsets by varying said test pattern subset sizes within said complete test pattern set.

14. The method according to claim 13, wherein said step (9) comprises:
    (10) determining a granularity for a testing environment.

15. The method according to claim 14, wherein said testing environment comprises one of the following set of:
    a manufacturing environment; and
    an engineering environment.

16. A system comprising an integrated circuit chip, said system that tests integrated circuit chips, comprising:
    a latch value generator that generates values for latches for a complete test pattern set:
    a test pattern divider that partitions said complete test pattern set into a plurality of partitioned test pattern subsets; and
    a tester that runs said partitioned test pattern subsets against said chip, said running comprising:
        executing one of said partitioned test pattern subsets against said chip to generate output;
        comparing said output to an expected result; and
        exiting said running of said partitioned test pattern subsets if said output does not match said expected result.

17. The system of claim 16, wherein the system could comprise at least one of a one chip device and a multiple chip module (MCM).

18. A system comprising an integrated circuit chip, comprising means for testing integrated circuit chips, comprising:
    means for generating values for latches for a complete test pattern set;
    means for partitioning said complete test pattern set into a plurality of partitioned test pattern subsets; and
    means for running said partitioned test pattern subsets against said chip, said running comprising:
        executing one of said partitioned test pattern subsets against said chip to generate output;
        comparing said output to an expected result; and
        exiting said running of said partitioned test pattern subsets if said output does not match said expected result.

* * * * *